(12) United States Patent
Gutwin et al.

(10) Patent No.: US 6,588,000 B2
(45) Date of Patent: Jul. 1, 2003

(54) METHOD OF PARTITIONING LARGE TRANSISTOR DESIGN TO FACILITATE TRANSISTOR LEVEL TIMING

(75) Inventors: Paul T. Gutwin, Williston, VT (US); Peter J. Osler, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,248

(22) Filed: Aug. 9, 2001

(65) Prior Publication Data

US 2003/0033583 A1 Feb. 13, 2003

(51) Int. Cl.[7] ............................................... G06F 17/50
(52) U.S. Cl. ................................................ 716/7; 716/2
(58) Field of Search .............................. 716/1, 2, 7, 8, 716/9, 10, 11

(56) References Cited

U.S. PATENT DOCUMENTS

| 4,831,543 A | | 5/1989 | Mastellone .................. 364/489 |
| 4,918,614 A | * | 4/1990 | Modarres et al. ............. 716/10 |
| 5,267,175 A | | 11/1993 | Hooper ....................... 364/489 |
| 5,448,493 A | * | 9/1995 | Topolewski et al. ........... 716/7 |
| 5,521,836 A | | 5/1996 | Hartoog et al. ............. 364/491 |
| 5,682,321 A | * | 10/1997 | Ding et al. .................. 257/208 |
| 5,805,861 A | | 9/1998 | Gilbert et al. .............. 395/500 |
| 6,028,991 A | | 2/2000 | Akashi ........................ 716/14 |
| 6,230,304 B1 | * | 5/2001 | Groeneveld et al. ........... 716/7 |

FOREIGN PATENT DOCUMENTS

| EP | 0 661 652 A1 | 7/1995 |
| EP | 0 977 128 A1 | 2/2000 |
| JP | 6-131413 | 5/1994 |
| JP | 11-232319 | 8/1999 |
| JP | 2000057183 A | 2/2000 |

OTHER PUBLICATIONS

Areibi, S. et al., "An Efficient Clustering Technique for Circuit Partitioning," ISCAS '96, pp. 671–674.*
Cherng, J.–S. et al., "An Efficient Two–Level Partitioning Algorithm for VLSI Circuits," Proceedings of ASP–DAC, Jan. 18–21, 1999, pp. 69–72.*
Shin, H. et al., "A Simple Yet Effective Technique for Partitioning," IEEE Transactions on VLSI Systems, vol. 1, No. 3, Sep. 1993, pp. 380–386.*

* cited by examiner

Primary Examiner—Leigh M. Garbowski
(74) Attorney, Agent, or Firm—Scully, Scott, Murphy & Presser; Richard M. Kotulak (57) ABSTRACT

A method and system for partitioning a large transistor design including transistors and transistor networks, and of the type having a top hierarchical design level and a second, lower hierarchical design level. The method comprises the steps of identifying a desired number of blocks for the second hierarchical level, representing the second hierarchical level as the desired number of blocks, each of the blocks having a boundary, and identifying transistor networks that extend across block boundaries. The method further comprises the steps of assigning transistor networks that cross block boundaries into the top hierarchical level to reduce cross boundary transistor networks, and re-assigning some of the transistors among the blocks to reduce the maximum number of transistors in any one block. Preferably, the transistors are assigned from one block to another by identifying partitions for groups of transistors; and then reassigning assigning transistors on the basis of said partitions. For example, the transistors may be partitioned on the basis of functionality, by name, to minimize connectivity, or to duplicate pre-existing hierarchy.

15 Claims, 11 Drawing Sheets

PARTITIONING schematics such that:

- Re-arrange
  - ▲ No cross-hierarchy CCCs
  - ▲ Partition size acceptable
  - ▲ Original hierarchy preserved

Figure 1

Why is Partitioning Important?

- Run time balancing
  - ▲ shortest job: 90 cpu Secs
  - ▲ longest job: 190000 cpu Secs

- Capacity constraints
  - ▲ How many transistors is too many?

- Accuracy
  - ▲ The larger the partition, the more accurate the timing

Ghost Partition Generation Methods

1. Partition due to functionality
2. Partition by name
3. Partition to minimize connectivity...partitions B,C
   1. Pick a random unmarked transistor
   2. mark its CCC
   3. find all unmarked xsistors driven by marked transistors
   4. mark their CCCs
   5. goto 3 until 50K transistors marked
4. Partition to duplicate pre-existing partition

```
function hierarchicalNameOfObject ( theObject ) {
  theHierarchicalDividerCharacter = '/'
  theParentProto = getProtoThatContainsObject ( theObject )
  if theParentProto is theRootProto
  then theBeginningOfTheName = ""
  else {
    theBox = getBoxThatIsLinkedToThisProto ( theParentProto )
    theBeginningOfTheName = hierarchicalNameOfObject ( theBox )
  } /* else */
  if theBeginningOfTheName is ""
  then theName = nameOfObjectInProto ( theObject )
  else theName = theBeginningOfTheName + theHierarchicalDividerChar + nameOfObjectInProto ( theObject )
  return theName
}
```

Figure 8

```
function newNameOfATransistorAsItMovesOneLevelUpInTheHierarchy ( theTransistor ) {
  theHierarchicalDividerCharacter = '/'
  theTransistorsNameBeforeItIsMoved = nameOfObjectInProto ( theTransistor )
  theParentProto = getProtoThatContainsObject ( theObject )
  theBox = getBoxThatIsLinkedToThisProto ( theParentProto )
  return nameOfObjectInProto ( theBox ) + theHierarchicalDividerChar + theTransistorsNameBeforeItIsMoved
}
```

Figure 9

```
function modifiedNameOfObjectInProto ( theObject ) {
  if ( theObject is a box AND
       the proto to which the box is linked has 'ghostProto = true' on it)
  then return ""
  return nameOfObjectInProto ( theObject )
} function newHierarchicalNameOfObject ( theObject ) {
  theHierarchicalDividerCharacter = '/'
  theParentProto = getProtoThatContainsObject ( theObject )
  if theParentProto is theRootProto
  then theBeginningOfTheName = ""
  else {
    theBox = getBoxThatIsLinkedToThisProto ( theParentProto )
    theBeginningOfTheName = hierarchicalNameOfObject ( theBox )
  } /* else */
  if theBeginningOfTheName is ""
  then theName = modifiedNameOfObjectInProto ( theObject )
  else theName = theBeginningOfTheName + theHierarchicalDividerChar + modifiedNameOfObjectInProto ( theObject )
  return theName
}
```

Figure 10

PROBLEM

- Hierarchy naming prevent isolating killNet

METHOD OF PARTITIONING LARGE TRANSISTOR DESIGN TO FACILITATE TRANSISTOR LEVEL TIMING

BACKGROUND OF THE INVENTION

1. Field of the Invention

This invention generally relates to manipulating the hierarchy of a large transistor level design, and more specifically, to manipulating the hierarchy of such designs to enable application of transistor level timing to the designs.

2. Prior Art

In a VLSI chip design consisting of many millions of transistors, hierarchy is employed to divide the design into some number of sub-designs, where the amount of information in the sub-design (being smaller than the amount of information in the complete design) is in some way more tractable. For instance, a design is divided hierarchically to meet software-tool constraints, or such that responsibility for each sub-design in the hierarchy can be parceled out to separate engineers.

An important part of the VLSI chip design is determining the operating frequency of the chip being designed, both for marketing reasons and design reasons. For example, if an engineer knows the slowest path (the path that determines the operating frequency), then that path can be fixed, making the chip go faster.

In the past, timing has been done at three levels:

A. transistor level circuit simulation: slow and of limited capacity, B. event based simulation: slow, low accuracy, high capacity, C. static timing analysis: fast, low accuracy, high capacity.

Recent advances have provided a new class of timers, referred to as "transistor-level-timers" (TLT). TLT is an order of magnitude slower than static timing analysis, but orders of magnitude faster than transistor level circuit simulation. TLT's capacity is an order of magnitude less than static timing analysis, but orders of magnitude more than transistor level circuit simulation. TLT's accuracy is not as good as transistor level circuit simulation, but much better than static timing analysis. Designers want to apply TLT to large designs, but have been limited by capacity constraints.

SUMMARY OF THE INVENTION

An object of the present invention is to provide an improved technique for manipulating the hierarchy of a large transistor level design.

Another object of this invention is to manipulate the hierarchy of a large transistor level design so as to enable application of transistor level timing to the design Addressing this problem is complicated by a number of facts. In particular, a transistor design usually comes with a pre-defined hierarchy; and for a number of reasons, this hierarchy is not suitable for direct application of TLT.

1. In TLT, partition boundaries introduce inaccuracy. The TLT design wants to have as small a number of partitions as possible, given other constraints, such as the maximum number of transistors in a partition that TLT can handle. Transistor level VLSI designs usually have a large number of very small partitions.

2. At the same time, chip designers want the hierarchy used in TLT to be as close as possible to the original design hierarchy, because that is what they're familiar with.

3. TLT times transistor structures called Channel Connected Components (CCC). It is a requirement that the TLT hierarchy have no cross hierarchy boundary CCCs. The original design hierarchy often has many cross hierarchy boundary CCCs.

Figure 1:
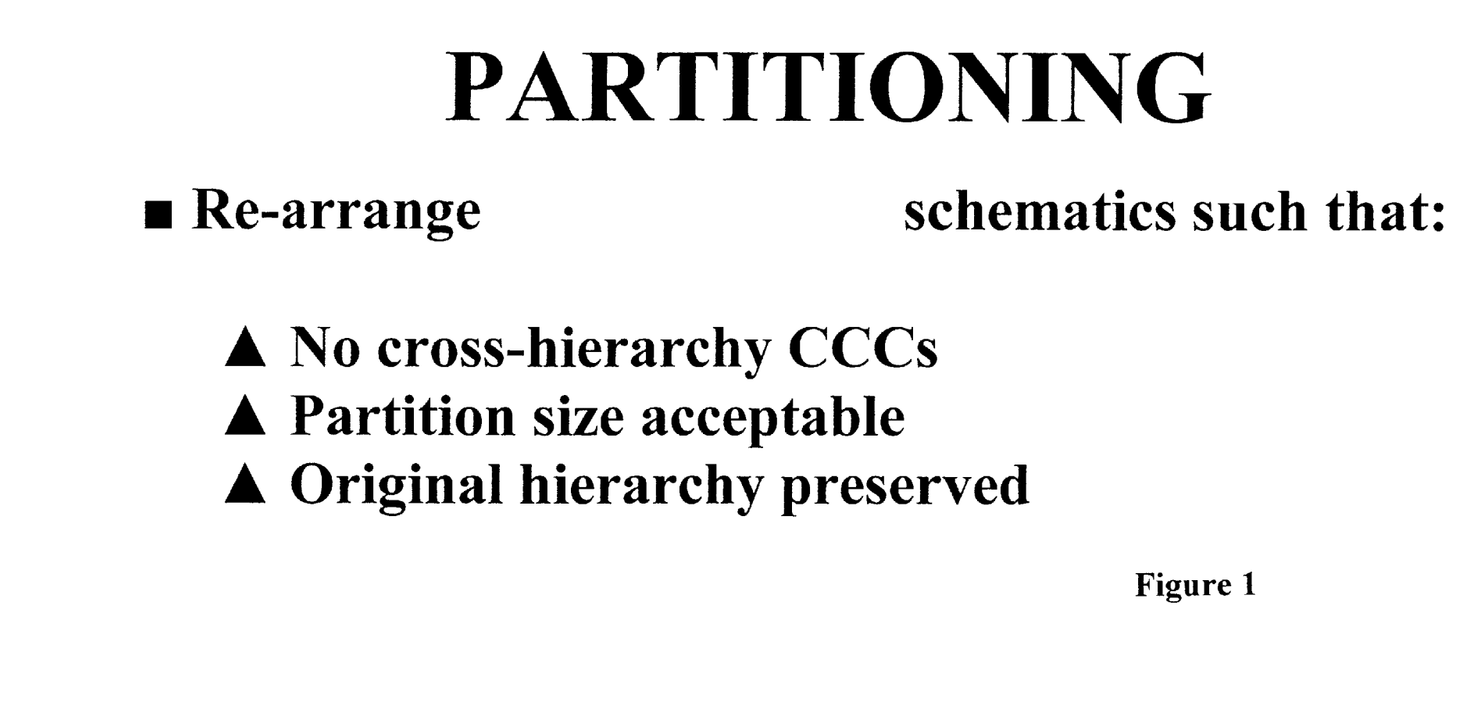
FIG. 1 indicates objectives that can be considered when partitioning a transistor design.

Thus, and with reference to FIG. 1, in order to properly rearrange the schematic, three requirements need to be addressed: (1) no cross-hierarchy boundary CCCs, (2) the partition size needs to be acceptable, and (3) preserving the original hierarchy.

These three requirements conflict with each other, and as a result an optimum compromise solution must be found in order to run TLT as accurately and quickly as possible, and to give designers information in a form that they can recognize.

The above-discussed problem is addressed, in accordance with the present invention, by providing a method and system for partitioning a large transistor design including transistors and transistor networks, and of the type having a top hierarchical design level and a second, lower hierarchical design level. The method comprises the steps of identifying a desired number of blocks for the second hierarchical level, representing the second hierarchical level as the desired number of blocks, each of the blocks having a boundary, and identifying transistor networks that extend across block boundaries. The method further comprises the steps of assigning transistor networks that cross block boundaries into the top hierarchical level to reduce cross boundary transistor networks, and re-assigning some of the transistors among the blocks to reduce the maximum number of transistors in any one block.

Preferably, the transistors are re-assigned among the blocks by identifying partitions for groups of transistors; and then reassigning transistors on the basis of those partitions. For example, the transistors may be partitioned on the basis of functionality, by name, to minimize connectivity, or to duplicate pre-existing hierarchy.

Figure 2:
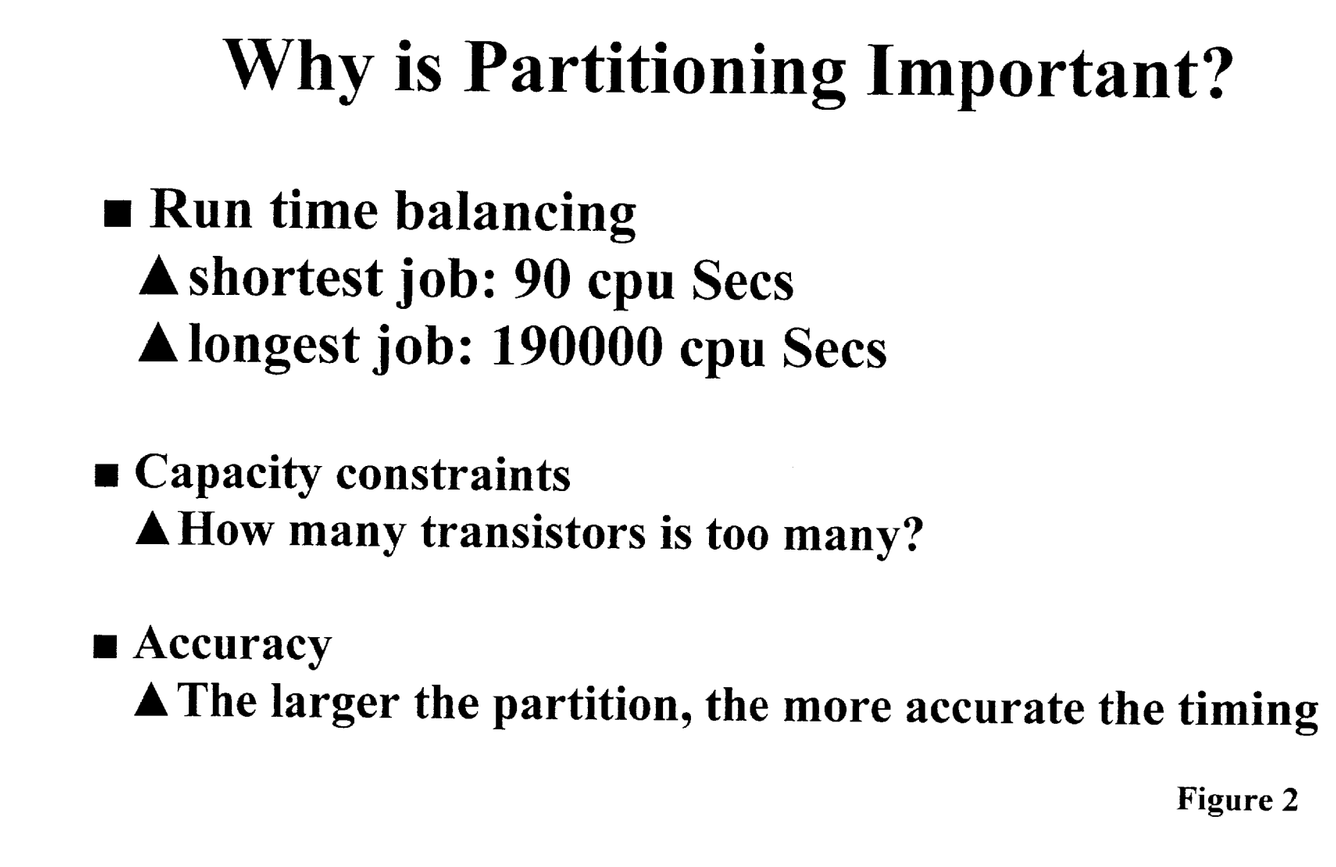
FIG. 2 indicates advantages that can be attained with this invention.

With reference to FIG. 2, the preferred partition procedure of this invention produces several advantages. Capacity constraint problems are reduced, in that one tool cannot do the entire chip; and accuracy is increased because the larger the partition, the more accurate the timing. Also, run time balancing is improved due to the fact that the partitions can be timed in parallel.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

The engineering design hierarchy of a large (1.5M) transistor design consists of a top level, with approximately twenty blocks at the next level down, with multiple levels beneath these twenty blocks, and with approximately 500 leaf cells in hierarchy. Dividing 1.5M transistors by twenty gives an average second level hierarchy size of 75K transistors, which is in the "sweet spot" of TLT hierarchy accuracy and run time. For example, for a size of 5K transistors, accuracy is lost due to boundary effects, although run time may be acceptable. At a 500K transistor size, great accuracy can be obtained, if TLT runs at all, and if it does run, it may be extremely slow.

Figure 3:
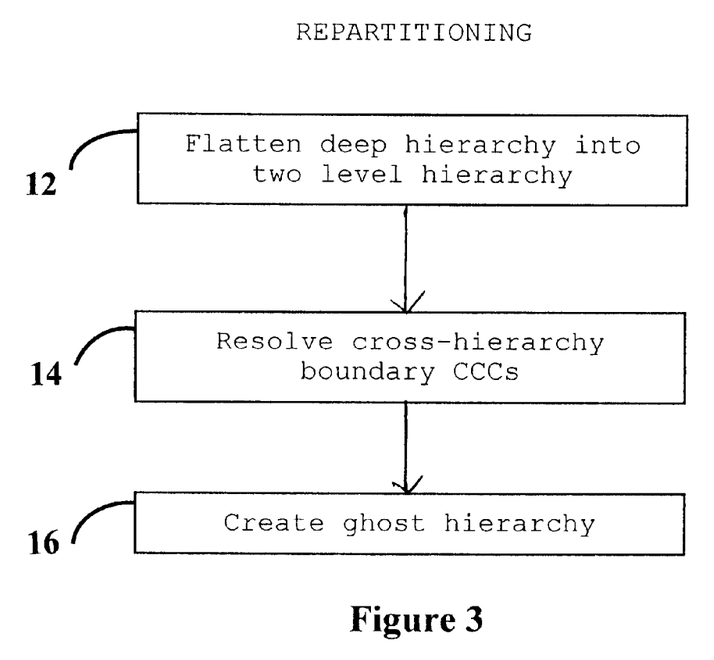
FIG. 3 outlines one method embodying this invention.

In accordance with the present invention, the transistors are repartitioned in and around the hierarchies to obtain the desired transistor distribution. With reference to FIG. 3, step 12 is to flatten deep hierarchy into two level hierarchy. Note that on the average we meet constraint 1 (but there could be specific design partitions that violate size constraints either too small or too big), we meet constraint 2 (the TLT hierarchy is a subset of original design hierarchy), but we have not yet dealt with constraint 3.

Step 14 is to resolve cross-hierarchy boundary CCCs by moving all transistors that participate in cross-hierarchy boundary CCCs into the top level. A CCC is a particular transistor topology. Cross hierarchy boundary CCCs occur occasionally, but are by no means endemic. The transistors that participate in cross hierarchy boundary CCCs are by definition connected to input and/or output nets of a partition. In other words, the percentage of transistors in a partition that participate in cross-hierarchy-boundary CCC, in relation to the total number of transistors in the partition, is proportional to the number-of-IO-nets/total-number-of-transistors-in-partition.

Moving cross-hierarchy-boundary CCC transistors into the top level violates constraint 2, but is a requirement to meet constraint 3 (which is a hard constraint). Making our partitions as large as possible reduces the violation of constraint 2 as much as possible.

Figure 4:
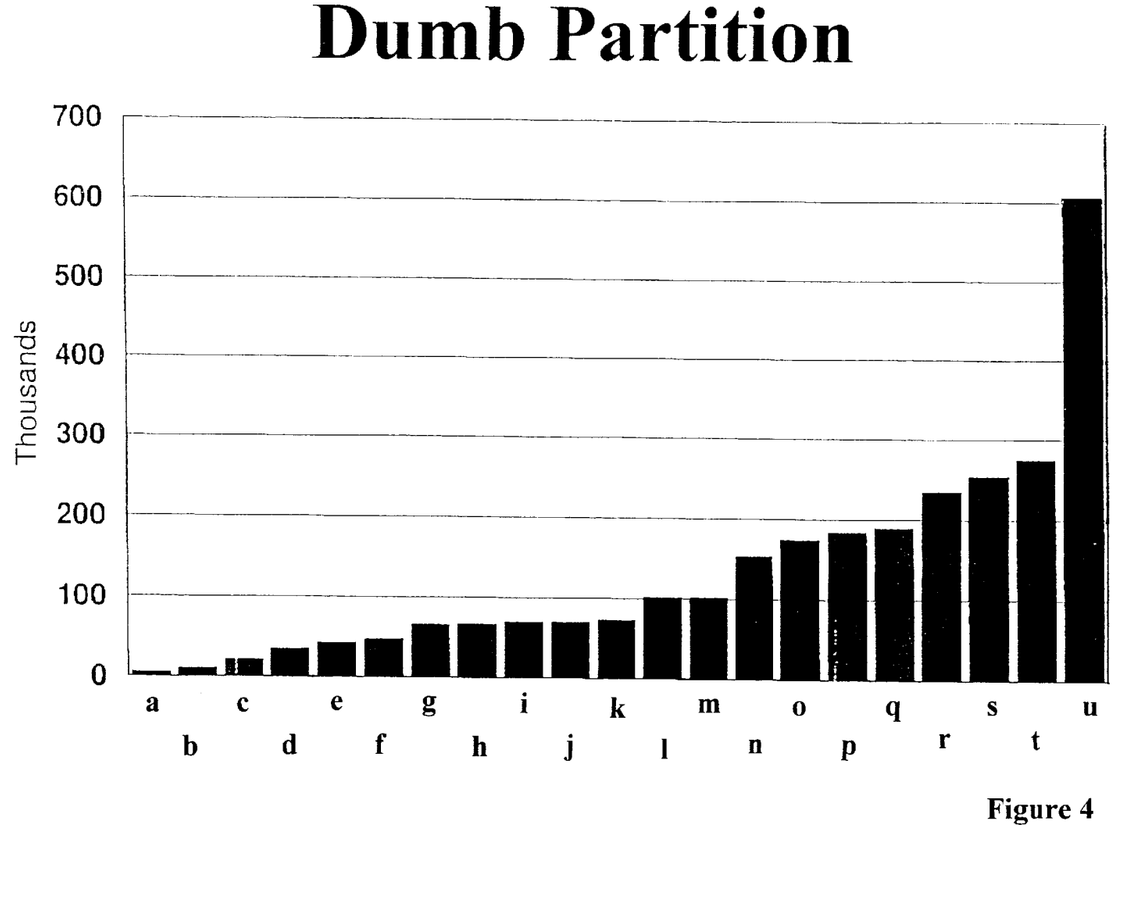
FIG. 4 depicts the distribution of transistors among a group of partitions.

At this point, we have a two level partition with no cross-hierarchy CCCs, where the average size (measured in number of transistors) of each partition meets constraint 1. However, the individual sizes of some of the partitions and perhaps the top-level may exceed the practical size requirements (such as the number of transistors that can be timed by TLT or reasonable run time requirements.). The graph of FIG. 4 indicates the distribution of the transistors among the partitions after steps 12 and 14. Note that the largest partition has over 600K transistors.

Step 16 involves the introduction of a feature referred to as "ghost-hierarchy." Specifically, we can create "new" hierarchy elements, either under the top level or under a second level partition, such that as a result all hierarchy elements wind up with an appropriate number of transistors.

Figure 5:
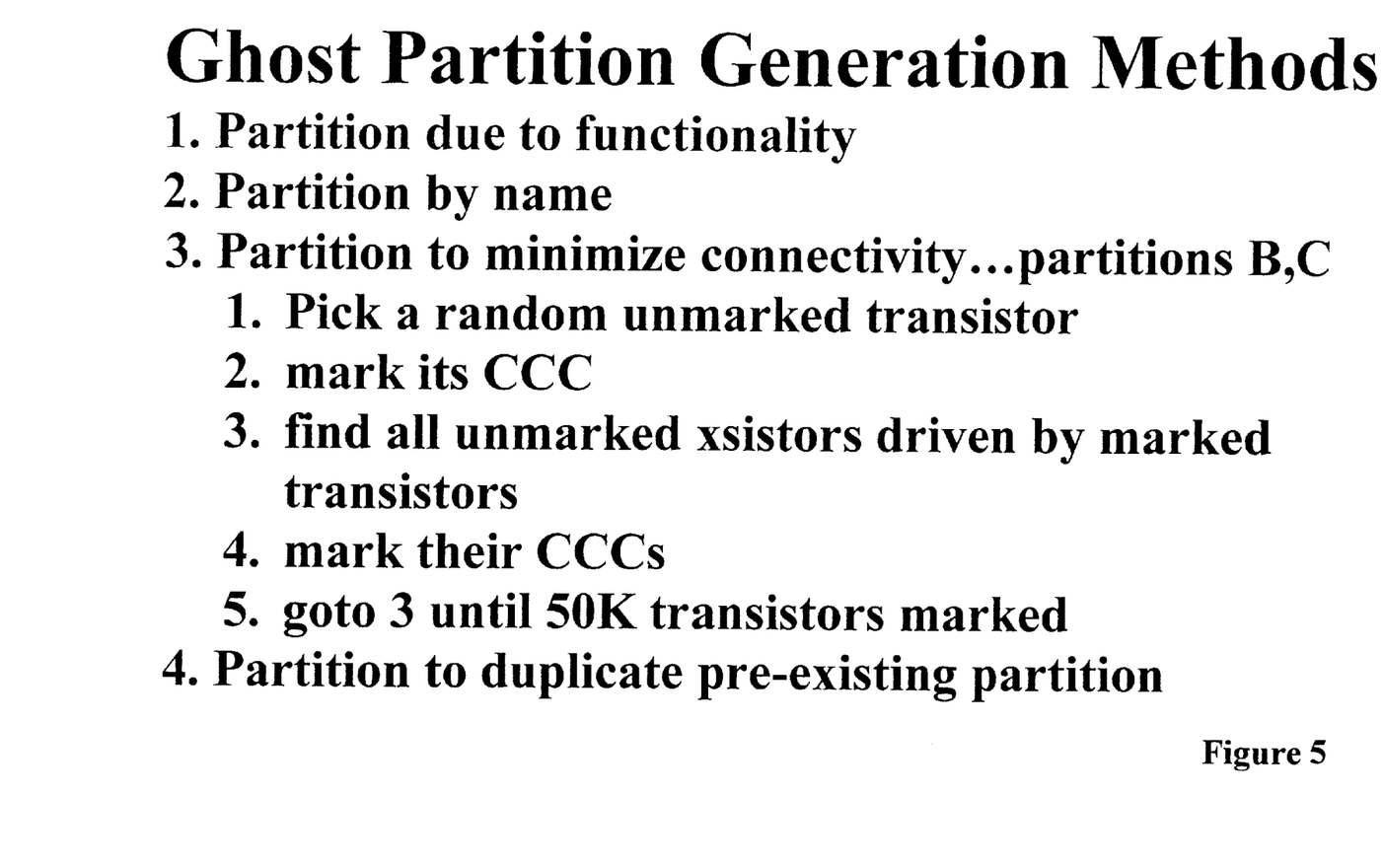
FIG. 5 outlines several ways to form a feature referred to as a ghost partition.

With reference to FIG. 5, ghost hierarchy elements can be created at least four different ways:

1. Partition due to functionality: Transistors that have a related function can be put into a ghost partition. The "KillNet", discussed below, is a good example of this. Any suitable procedure or rule may be used to determine how transistors that have a related function are identified.

2. Partition by name: Transistors that have similar names can be grouped together in a ghost partition. For example, with one known chip design, the partition "FUU" had a huge number of transistors, and a huge number of cross-hierarchy CCCs. Almost 200K transistors were moved from FUU into top-level during step 2. A ghost-partition for these 200K transistors was created, based on their names.

3. Partition to minimize connectivity: The following algorithm may be used to accumulate a set number of transistors (in this case 80K) in a ghost partition:
    a. find an arbitrary transistor to move into ghost-partition and move it.
    b. find all nets that now cross boundaries from ghost partition into parent, and move all parent-level transistors attached to those cross-boundary nets into ghost partition.
    c. repeat b. until a specified number (80K for instance) of transistors have been moved.

4. Partition to duplicate pre-existing hierarchy: At certain times we want partitioning to duplicate the behavior of previous partitioning activity. For example, if a new version of a design is received, we want to re-partition the new version of the design the same as we partitioned the old design. The following algorithm may be used to re-create a partition given a list of transistors in an old partition.

For each transistor in the list, locate the transistor by name in new design, move the transistor into ghost partition.

Figure 6:
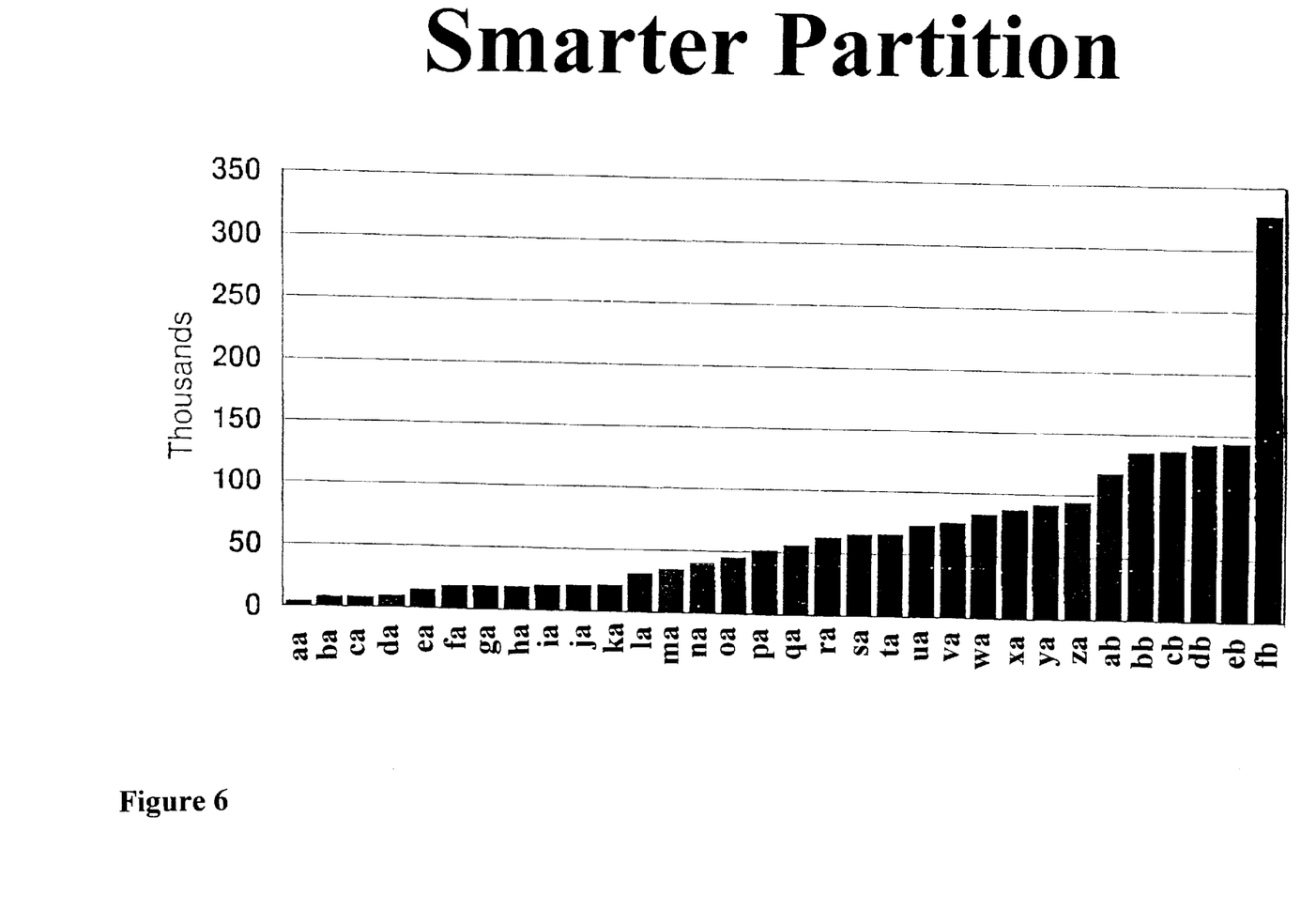
FIG. 6 illustrates the distribution of transistors among a group of partitions after intermediate repartitioning of the transistor design.
Figure 7:
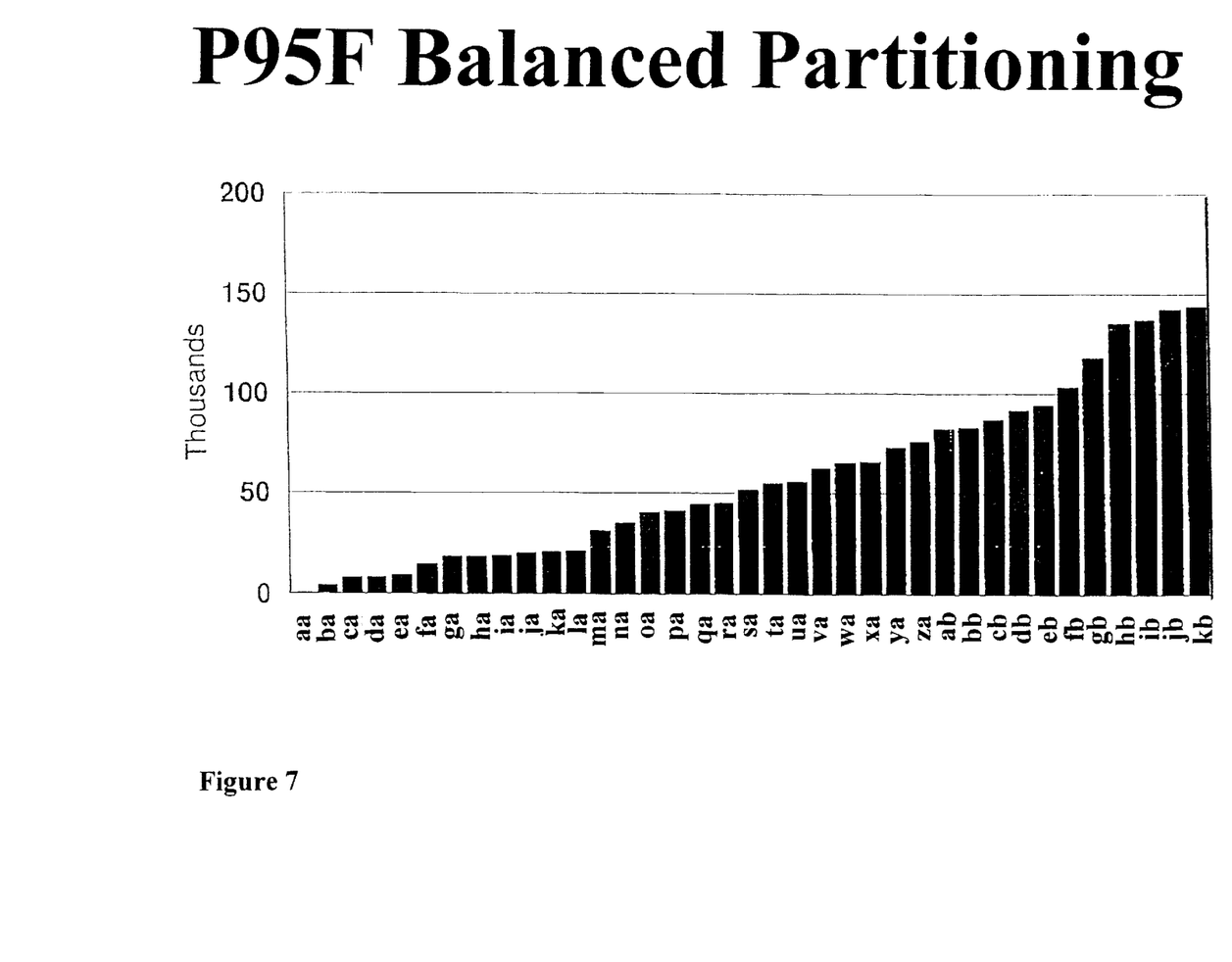
FIG. 7 shows the distribution of transistors after a final repartitioning of the transistor design.

FIG. 6 illustrates an intermediate distribution of transistors between partitions. The number of partitions has increased from 21 to 34, and the size of the largest partition is down to about 350K transistors. FIG. 7 shows the final partition, after step 16. The number of partitions has increased to 37, and the maximum partition sizes is less than 150K.

In accordance with another aspect of this invention, a hierarchical naming procedure is provided that keeps constant the names of objects even when the hierarchical level of the object changes.

In the context of this aspect of the disclosure, the term "proto" refers to a portion of a hierarchical design. Protos may contain boxes, nets, and ports. Protos are named uniquely. In any design, one proto is designated as the root proto, from which the entire design can be discerned by descending through the hierarchy that is connected to the root proto. A "port" is an external connection on a proto. A port has one of three different types, input, output, or bidirectional. Ports on a particular proto are named uniquely.

A "box" represents an abstraction of an underlying portion of the design. A box has pins. A box has a link to the proto that contains the detail information for the underlying portion of the design. Boxes in a particular proto are uniquely named. A box can be either a leaf-cell or a parent. In the case of a parent box, the underlying proto to which the box is linked is available for analysis. In the case of a leaf-cell, the underlying proto is not available for detail analysis.

A "net" represents a connection between ports and/or pins. A net can be connected to any number of pins or ports. All nets in a particular proto are uniquely named. A "pin" is an external connection on a box. A pin has one of three types, input, output, or bidirectional. All pins on a particular box are uniquely named. There is a unidirectional mapping from box-pins to the ports of the underlying proto.

Figure 8:
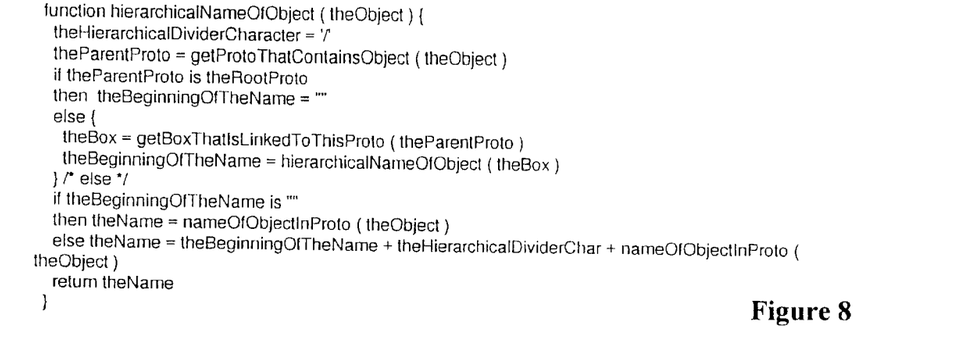
FIG. 8 shows pseudo-code for a hierarchical based naming procedure.

In a hierarchy, objects of similar types (nets for instance, or transistors) must all have distinct names, and one simple convention is to give similar objects in a proto unique names across the entire hierarchical design. FIG. 8 shows pseudo-code that specifies such a hierarchical naming convention; and with this naming convention, the hierarchical name of an object is the name of all the levels in the hierarchy between the object and the root, separated by a hierarchical divider character, followed by the name of the object.

Figure 9:
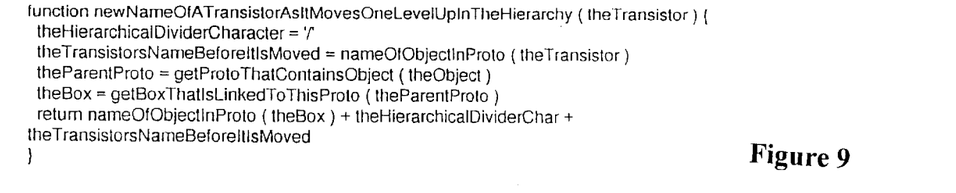
FIG. 9 shows pseudo-code for determining a new name for an object as it moves up in a hierarchy.

This naming convention is not particularly well suited for all situations, and, in particular, it is not always well suited for situations where an object is moved across hierarchy boundaries. Generally, names of objects can be preserved as they move around in the hierarchy as long as they only move up the hierarchy, and FIG. 9 shows pseudo-code that defines how to determine the new name of an object, specifically a transistor, as it moves one level up in the hierarchy.

Introducing hierarchy, however, causes names to change, and changed names cause incompatibilities with other portions of the design process.

Preferably, in this situation—where we are modifying a hierarchy to match capabilities other than for which the original hierarchy was designed, and specifically, when we are introducing new levels of hierarchy through hierarchical decomposition—then on the new protos that we are introducing into the design, we match the new protos with a unique mark, for example, a keyword value pair such as: ghostProto=true.

Figure 10:
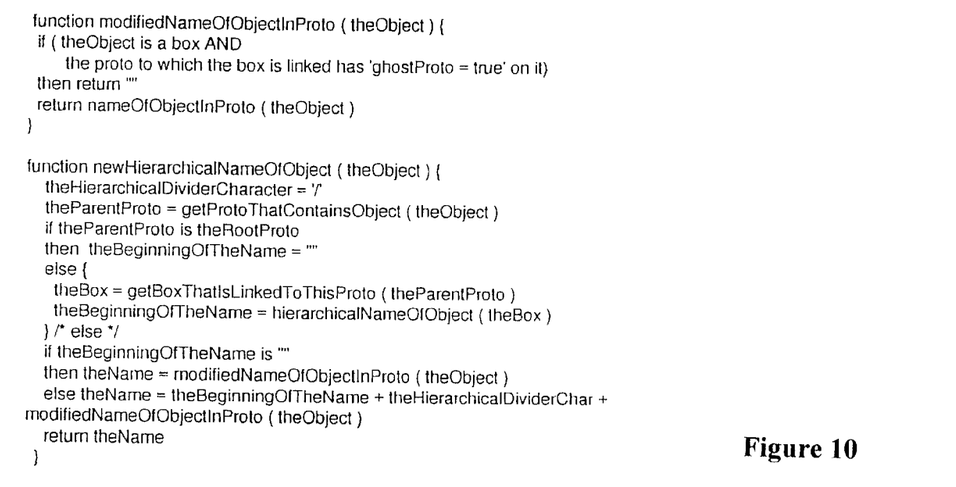
FIG. 10 shows pseudo-code for a naming procedure in accordance with one aspect of this invention.

Then, the hierarchical naming algorithm is modified, for example as shown in FIG. 10, so that the ghostProto function keeps the name of that level of the hierarchy from being inserted into the hierarchical name as it is being generated.

This hierarchical naming procedure may be used in many specific applications. For instance the procedure may be applied to VLSI design. The procedure can be applied to any hierarchical design, such as a mechanical design.

One particular situation, as an example, where this naming procedure can be used is in applying a transistor level timer (TLT) to a design of a large custom microprocessor. In this example, the designer needs to manipulate the hierarchy subject to the following rules.

1. The original hierarchy cannot be changed, 2. The designer wants to preserve as much of the original design hierarchy as possible, 3. The designer is subject to capacity restrictions due to TLT, and 4. It is necessary to move transistors around in the hierarchy due to TLT topology constraints.

Because of this last constraint, there are more transistors at the top level of the timing hierarchy than TLT can handle. To mitigate this problem, the hierarchical decomposition preserving name technique of this invention may be used.

Figure 11:
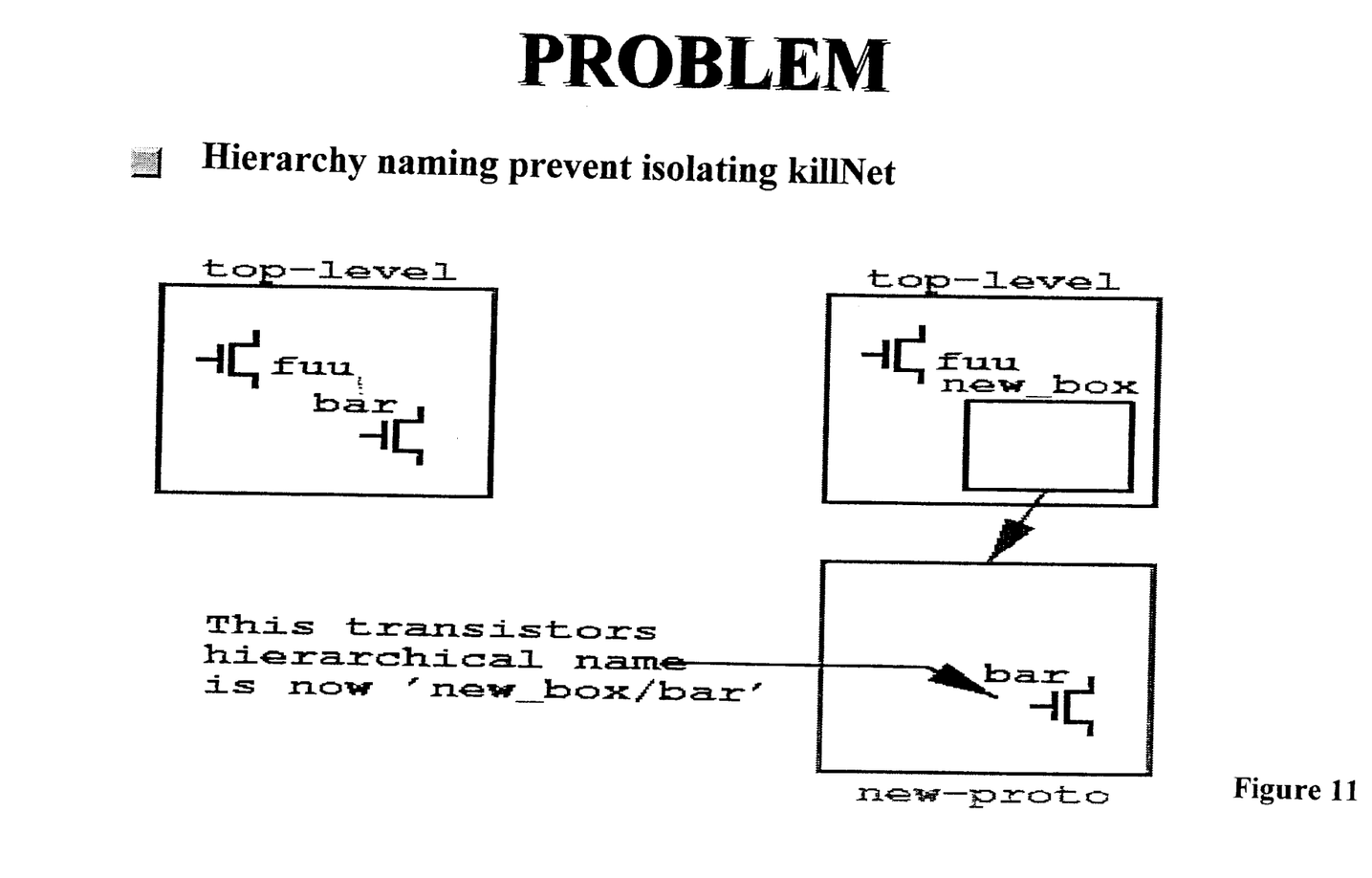
FIG. 11 diagrammatically illustrates the application of a prior art naming procedure.
Figure 12:
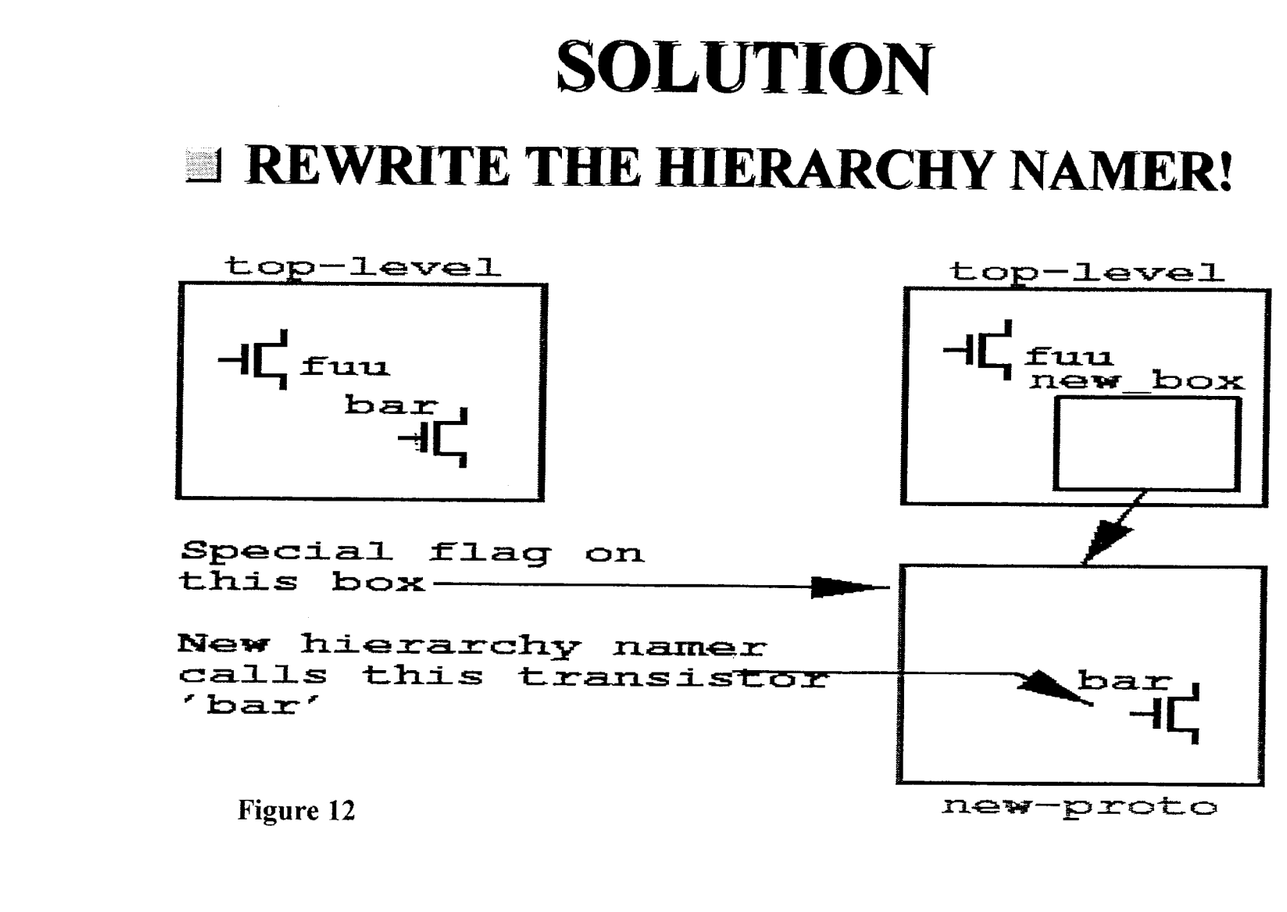
FIG. 12 diagrammatically illustrates the application of a preferred naming procedure.

FIGS. 11 and 12 diagrammatically illustrate the application of the present invention in contrast with the prior art. As shown in FIG. 11, with the prior art, when a new hierarchy is added that includes the transistor "bar," the name of the transistor changes to "new-box bar." However, with the preferred naming procedure described above, and as shown in FIG. 12, the transistor "bar" retains its name despite the addition of a new hierarchy.

Figure 13:
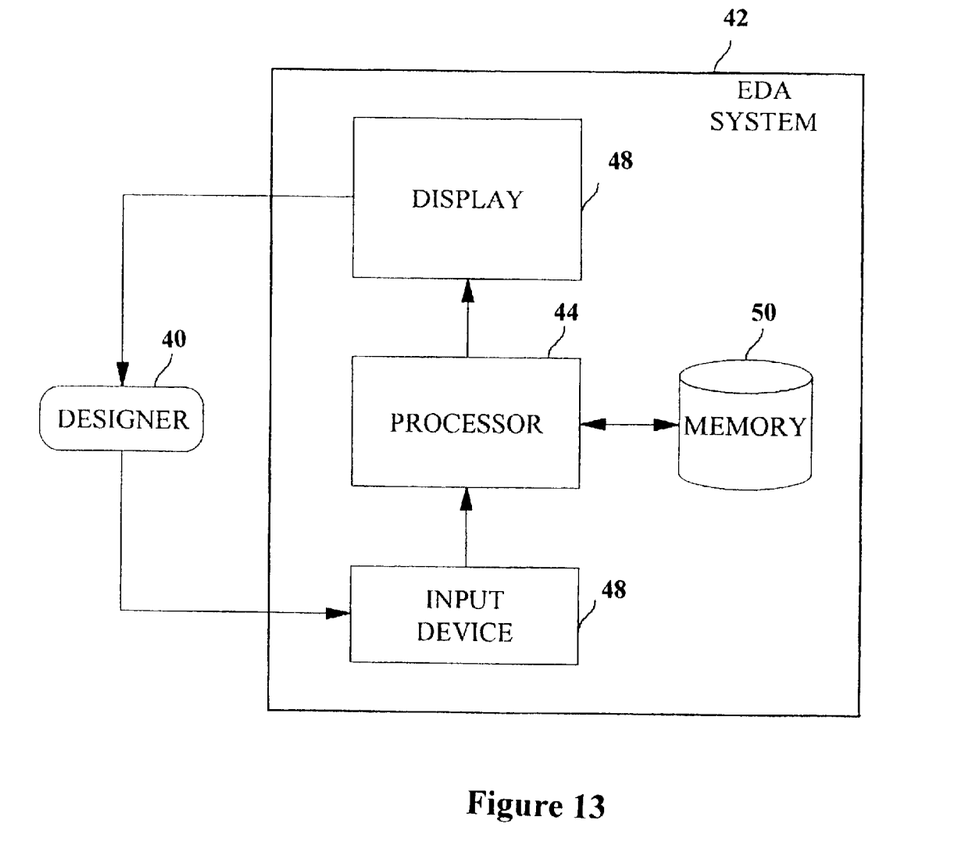
FIG. 13 is a block diagram of a computer based environment in which the present invention may be used.

The present invention has particular applicability in the design of complex integrated circuits using electronic design automation (EDA) systems, and FIG. 13 is a block diagram of a computer based environment in which this invention may be used.

A designer 40 interacts with an electronic design automation system 42 to enter an integrated circuit design, validate the design, place the design's components on a chip, and route the interconnections among the components. The integrated circuit may be an application specific integrated circuit (ASIC). The EDA system 42 includes a processor 44, which executes operating system software as well as application programs known as EDA software. The EDA system 42 is intended to be representative of a category of data processors suitable for supporting EDA operations.

The designer 40 enters design information into the EDA system by using a well-known input device 46 such as a mouse, a keyboard, or a combination of the two devices. It should be understood, however, that the input device may actually consist of a card reader, magnetic or paper tape reader, or other well-known input device (including another computer system). A mouse or other cursor control device is typically used as an input device as a convenient means to input information to the EDA system to select command modes, edit input data, and the like.

Visual feedback of the design process is given to the designer by showing the design being constructed as graphical symbols on display 48. The display is used to display messages and symbols to the designer. Such a display 48 may take the form of any of several well-known varieties of CRT displays. The EDA software being executed by the processor 44 stores information relating to the logic design in memory 50. The memory may take the form of a semiconductor memory, magnetic disks, optical disks, magnetic tape or other mass storage device.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of partitioning a large transistor design including transistors and transistor networks, and of the type having a top hierarchical design level and a second, lower hierarchical design level, the method comprising:
   identifying a desired number of blocks for the second hierarchical level;
   representing the second hierarchical level as the desired number of blocks, each of the blocks having a boundary;
   identifying transistor networks that extend across block boundaries;
   re-assigning transistor networks that cross block boundaries into the top hierarchical level to reduce cross boundary transistor networks, and
   further re-assigning some of the transistors, tat had been re-assigned back into the top hierarchical level, among the blocks to reduce the maximum number of transistors in any one block.

2. A method according to claim 1, wherein the step of re-assigning some of the transistors includes the steps of:
   identifying partitions for groups of transistors; and
   re-assigning transistors on the basis of said partitions.

3. A method according to claim 2, wherein the step of identifying partitions includes the step of identifying partitions on the basis of transistor functionality.

4. A method according to claim 2, wherein the step of identifying partitions includes the step of identifying partitions on the basis of transistor name.

5. A method according to claim 2, wherein the step of identifying partitions includes the step of identifying partitions to reduce connectivity.

6. A system for partitioning a large transistor design including transistors and transistor networks, and of the type having a top hierarchical design level and a second, lower hierarchical design level, the system comprising:

means for identifying a desired number of blocks for the second hierarchical level;

means for representing the second hierarchical level as the desired number of blocks, each of the blocks having a boundary;

means for identifying transistor networks that extend across block boundaries;

means for re-assigning transistor networks that cross block boundaries into the top hierarchical level to reduce cross boundary transistor networks, and means for further re-assigning some of the transistors, that had been re-assigned back into the top hierarchical level, among the blocks to reduce the maximum number of transistors in any one block.

7. A system according to claim 6, wherein the means for re-assigning some of the transistors includes:

means for identifying partitions for groups of transistors; and means for re-assigning transistors on the basis of said partitions.

8. A system according to claim 7, wherein the means for identifying partitions includes means for identifying partitions on the basis of transistor functionality.

9. A system according to claim 7, wherein the means for identifying partitions includes means for identifying partitions on the basis of transistor name.

10. A system according to claim 7, wherein the means for identifying partitions includes means for identifying partitions to reduce connectivity.

11. A program storage device readable by machine, tangibly embodying a program of instructions executable by the machine to perform method steps for partitioning a large transistor design including transistors and transistor networks, and of the type having a top hierarchical design level and a second, lower hierarchical design level, the method steps comprising:

identifying a desired number of blocks for the second hierarchical level;

representing the second hierarchical level as the desired number of blocks, each of the blocks having a boundary, identifying transistor networks that extend across block boundaries;

re-assigning transistor networks that cross block boundaries into the top hierarchical level to reduce cross boundary transistor networks, and further re-assigning some of the transistors, that had been re-assigned back into the top hierarchical level, among the blocks to reduce the maximum number of transistors in any one block.

12. A program storage device according to claim 11, wherein the step of re-assigning some of the transistors includes the steps of:

identifying partitions for groups of transistors; and re-assigning transistors on the basis of said partitions.

13. A program storage device according to claim 12, wherein the step of identifying partitions includes the step of identifying partitions on the basis of transistor functionality.

14. A program storage device according to claim 12, wherein the step of identifying partitions includes the step of identifying partitions on the basis of transistor name.

15. A program storage device according to claim 12, wherein the step of identifying partitions includes the step of identifying partitions to reduce connectivity.

* * * * *